United States Patent [19]
Fujita

[11] Patent Number: 6,018,482
[45] Date of Patent: Jan. 25, 2000

[54] HIGH EFFICIENCY REDUNDANCY SCHEME FOR SEMICONDUCTOR MEMORY DEVICE

[75] Inventor: Mamoru Fujita, Tokyo, Japan

[73] Assignee: NEC Corporation, Tokyo, Japan

[21] Appl. No.: 09/110,297

[22] Filed: Jul. 6, 1998

[30] Foreign Application Priority Data

Jul. 7, 1997 [JP] Japan ..................................... 9-181232

[51] Int. Cl.[7] ...................................................... G11C 7/00
[52] U.S. Cl. ............... 365/200; 365/189.07; 365/230.03; 365/230.06
[58] Field of Search ............................. 365/200, 230.03, 365/230.06, 189.07

[56] References Cited

FOREIGN PATENT DOCUMENTS 8-279300  10/1996  Japan .

Primary Examiner—David Nelms
Assistant Examiner—Gene N. Auduong
Attorney, Agent, or Firm—McGinn & Gibb, P.C.

[57] ABSTRACT

A semiconductor memory device is provided that includes a plurality of normal memory cells, a device for activating the memory cells in response to an externally applied address and a plurality of redundant memory cells. A memory and comparison device may include a device for storing an address of a failed memory cell existing within a plurality of normal memory cells and a device for comparing the externally applied address with the failed memory cell address. A redundant memory cell selection device may select any one of a plurality of redundant memory cells in response to an output signal output from the memory and comparison device. A redundant memory cell activating device may activate the redundant memory cell, responsive to an output of the memory and comparison device.

20 Claims, 12 Drawing Sheets

(a)

(b)

HIGH EFFICIENCY REDUNDANCY SCHEME FOR SEMICONDUCTOR MEMORY DEVICE

BACKGROUND OF THE INVENTION

1. Field of the Invention

The present invention relates to a semiconductor memory device and more specifically to means for repairing a memory cell.

2. Description of Related Art

FIG. 12 is a block diagram which shows the prior art, while FIG. 13(a) and FIG. 13(b) are timing diagrams which show the operation thereof, and FIG. 13(a) showing the case of selecting a redundant memory cell, and FIG. 13(b) showing the case in which a redundant memory cell is not selected.

The description that follows applies to the case in which the number of banks is 2 (these being ARRAY0 and ARRAY1), the number of sub-arrays that make up each bank is 4 (these being SAB00 through SAB03 and SAB10 through SAB13), and the total number of sub-word lines included in the device is 512, the number of sub-arrays each contains a certain number of sub-word lines therein is not shown, though.

The description will make use of the hierarchical word line architecture.

In presenting this description, the number of sub-word lines with respect to 1 main word line MWL will be taken as 8 lines.

Therefore, the row addresses of each of the banks have 11 bits (X0 through X10), of which X9 through X10 are the sub-array, X3 through X8 are the main word lines within the sub-array, and X0 through X2 distinguish between the 8 sub-word lines with respect to each main word.

The replacement of a failed memory cell with a redundant memory cell is performed by two row address lines, which are distinguished by X0. Each sub-array has 1 redundant main word line RMWL and 8 sub-redundant word lines that are connected thereto.

The operation of the circuit is described below, with reference made to the circuit diagram and the timing diagram. In FIG. 13(a) and FIG. 13(b), ACT is a signal that indicates that the corresponding bank is active, and a command decoder or the like (not shown in the drawing) is used to operate the circuit in response to externally input commands.

In FIG. 12, XADD, which is made up of 11 bits, are the row address signals, and an address buffer or the like (not shown in the drawing) inputs this from outside, in accordance with the ACT signal.

XABF is a row address signal buffer circuit, this generating the complimentary signals X1N through X10N and X1T through X10T, in accordance with X1 through X10 of the XADD signals. XRED is a failed cell storage and comparison circuit, i.e., the memory and comparison means (XRED). Each of the XRED circuits has stored in it the failed address that is to be replaced.

FIG. 14 is a circuit diagram which shows an example of the redundancy decoder XRED. The XRED performs a comparison of the row address XADD signals and the failure address that is stored within the XRED.

In this example, because replacement is done in units of 2 sub-word lines, X1 through X10, which make up the XADD signals, are stored. Sub-word lines such as is distinguished by X0, for example, the row addresses 0 and 1 are not distinguished within XRED, so that the address is taken to be a failure address regardless of which of them is input.

In this circuit, a replacement address is stored by blowing the fuses F1N through F10N and F1T through F10T. While there is no particular restriction on the method of blowing a fuse, the generally used method is that of blowing a fuse with a laser beam.

Storage is made of one bit, which indicates which fuse, of FnN and FnT replacement addresses, is blown. For example, if the replacement addresses are 0 and 1, F1N through F10N are blown, and F1T through F10T are not blown.

The operation of this circuit is as follows. First, all of the XADDs are at low level, the PXR signal changes to the low level, and the node 100 changes to the high level.

Then, based on an externally input address signal, of the complimentary 11-bit signals that make up the XADD signals, X1N through X10N and X1T through X10T are set.

When this is done, because XnN and XnT (where n=1 to 10) are mutually complimentary signals, one of them is at the high level and the other is at the low level. For example, if the row address is 0 or 1, X1N through X10N are high level, and X1T through X10T are at low level.

Therefore, unless the replacement address stored in the fuses FnN and FnT coincide with the XADD signals, node 100 and node 101 are connected to one another.

If the PXR signal changes to the high level, when the replacement address does not coincide with the XADD signal, node 100 changes to the low level, but when these coincide, the node 100 holds at the high level. This is held at the node 102 by means of the latch signal XLAT, and is output as the signal XREBL. When the ACT signal changes to the low level, all of the XREBL signals are unselected by the XPRE signal, the result being that the selected redundancy memory cell is unselected.

FIG. 15 is a circuit diagram which shows an example of an XRDN circuit, which is a circuit that selects a redundancy memory cell, these XRDN circuits existing in a one-to-one correspondence with the redundant row decoders RXDC.

Because there is one XRED circuit for each 2 sub-word lines, there is 1 XRDN circuit for each 4 XRED circuit. This ratio is the ratio between the number of main word lines to sub-word lines.

When one of the XREBL signals connected to it changes to the high level, the XRDN pulls down a XRDNS signal that is at the high level by means of a precharge circuit (not shown in the drawing). The XRDNS signal is a signal which indicates that a redundant memory cell is selected. When an RXDS signal is at the high level, the row decoder RXDC, which is connected one-to-one which each thereof, is activated.

Additionally, the RRAIS1 and RRAIS2 signals, which are high by means of a pre-charge circuit (not shown in the drawing), are selectively brought down by the XREBL signal.

Of the 4 connected XREBL signals, although the signal is not brought down if the XREBL0 signal changes to the high level, if the XREBL1 changes to the high level, RRAIS1 only is brought down, if XREBL2 is high level RRAIS2 only is brought down, and if XREBL3 is high level both RRAIS1 and RRAIS2 are brought down.

Therefore, the relationship of states of the RRAAIS signal states when they coincide with the comparison results of each of the XRED circuits is fixed.

The XRED and XRDN circuits each are assigned in a fixed manner to banks, and operate only when the corresponding bank is selected.

Additionally, PXR, XLAT, XPRE, RXDS, and XRDNS signals exist independently for each bank, and operate independently.

XPR shown in FIG. 12 is a row address decoder, which generate a row address decode signal PXADD from the row address signal XADD. PXADD is made up of the 8 signals X3N4N5N through X3T4T5T that are pre-decoded from X3 through X5, the 8 signals X6N7N8N through X6T7T8T that are pre-decoded from X6 through X8, and the 4 signals X9N10N through X9T10T that are pre-decoded from X9 and X10.

The 8 signals X3T4T5T and 8 signals X6T7T8T and so forth are used for XDEC selection within each of the sub-arrays, while the 4 signals X9T10T and so forth are used for sub-array selection in the SXC circuit.

PXADD is delayed within the XPR for the purpose of selecting or unselecting a redundant memory cell, and is latched by the XLAT signal. When the ACT signal changes to the low level, the XPRE signal makes all of the PXADD signals unselected, the result being that the selected memory cell is also unselected.

FIG. 16 is a circuit diagram which shows an example of an SXC circuit. The SXC circuit is a sub-array selection circuit which, when XADD does not coincide with all the failure replacement addresses that are stored in XRED and the RXDS signal remains at the high level, based on the PXADD signal (X9 and X10), activates a sense amplifier column that is not explicitly shown in the drawing but which is included in the corresponding sub-array, and also activates the sub-array selection signal BSEL.

In the case in which XADD coincides with some failure replacement address that is stored in XRED and the RXDS signal is at the low level, based on the XRDNS signal the sense amplifier column is activated, as is the BSEL signal.

When this is done, in the case in which there is no coincidence between the sub-array indicated by PXADD and the sub-array indicated by XRDNS, the activation of a redundant main word line within the sub-array indicated by PXADD and of the sense amplifier column is suppressed. In either case, the activated sense amplifier column is included in the sub-array that includes the activated word line.

FIG. 17 is a circuit diagram which shows an example of an XDEC circuit.

The XDEC circuit is a row decoder, which activates a main word line MWL, based on the PXADD signal (X3 through X8) and the BSEL signal. In the case, however, in which XADD coincides with a replacement address that is stored in any XRED and the RXDS signal is at the low level, the activation is not done.

FIG. 18 is a circuit diagram which shows an example of an RXDC circuit.

The RXDC circuit is a redundant row decoder which, in the case in which XADD coincides with a replacement address that is stored in any XRED, based on the XRDNS signal, activates the corresponding redundant main word line RMWL.

By doing this, the main word line that includes the failure address is replaced by the redundant main word line.

FIG. 19 is a circuit diagram which shows an example of an RAIS circuit.

The RAIS circuit is a sub-word line selection circuit which, when XADD does not coincide with a failure replacement address in any XRED circuit and the RXDS signal is at the high level, activates only one line within RAI0 through RAI17, in accordance with XADD (X0 through X2).

If, however, XADD coincides with a failure replacement address in an XRED and the RXDS signal is at the low level, selection is made of the RRAIS1 signal in place of X1 of XADD, the RRAIS2 signal in place of X2, and one line of RAI0 through RA17 for X0 of XADD.

The main word line MWL and the sub-array line selection signal RAI are input to a sub-word driver circuit (not shown in the drawing), the logical AND thereof selecting the sub-word line SWL. The sub-word line SWL is directly connected to a memory cell, thereby activating it.

As described above, in the prior art, the relationship of the redundancy decoder XRED and a main word line and RAI signal that are activated thereby is fixed, the result being that the relationship between each XRED and sub-word line is fixed.

The number of sub-word lines the replacement of which is handled by a single redundancy decoder XRED (2 in this case) is also fixed.

In this case, there are 4 redundant main word lines in each bank, and 32 sub-word line word lines corresponding thereto. Because there are 16 XRED circuits within 1 bank, with replacement at the XRED circuits being done in units of 2 sub-word lines that share an address other than X0, unless all failure locations each have only one row address or are located within two addresses that share an address other than X0, it is only possible to repair a maximum of 16 locations within each bank.

However, in a case in which the various failure locations are not controlled by commonly used 2 addresses other than X0, for example the case in which a main word line (corresponding to 8 sub-word lines that share addresses other than X0 through X2) has failed, 4 XRED circuits are used to replace 8 sub-word lines.

In this case, 16 XRED circuits are used for each bank to enable repair of 4 main word lines.

In either case, the XRED circuits and redundant sub-word lines that are used to replace a failure are used only within each bank, and are not dependent upon a failure replacement condition in another bank.

A synchronous DRAM or the like is generally divided into internal memory cell arrays, each of which operates independently. Each of these divisions is called a bank. Within each bank, a memory cell group is activated when it is specified by an externally input address signal.

When this is done, it is possible for various banks to be simultaneously activated, the addresses of activated memory cell groups being independent between each of the banks.

Therefore, in the case for example in which a redundant memory cell which is physically located within bank A is to replace a failed memory cell which is physically located within bank B, when both banks are activated, two memory cell groups within bank A will be activated.

In the case in which these groups share a sense amplifier and data lines or the like, proper operation might be impaired. Because the addresses of the two memory cell groups are independent and can be arbitrarily specified from outside, it is not possible to avoid this problem for all combinations of addresses.

It is therefore impossible to perform repair with redundant memory cells that are shared between banks, the failed memory cells within each bank being repairable only by redundant memory cells within that bank.

Because of this, in a chip in which there is a grouping of failed memory cells existing in some particular banks, at the point at which it becomes impossible to repair a failed memory cell with a redundant memory cell in even one bank, it becomes impossible to repair the overall chip, this leading to a reduction in yield.

In a semiconductor device, there exist a number of patterns of addresses for failed bits, these being related to the construction and manufacture of the semiconductor device.

For example, these can be classified, into failures that can be repaired by the replacement of a single row address, such as single-bit failures that are attributable to a transistor that makes up a memory cell and single-line failures that are attributable to open wiring within a memory cell array, and failures that can be repaired by the replacement of a plurality of row addresses, such as row decoder circuit failures and adjacent-line failures that are caused by shorts in wiring within a memory cell array.

With regard to failures that require the replacement of a plurality of rows, because of the size of impurities that are attached during processing, which are the major cause of shorts between wiring, the number of adjacent row addresses that require replacement is indeterminate.

In the prior art, therefore, using a single redundancy decoder to perform repair with a fixed number of lines, if the number of adjacent row addresses requiring replacement exceeds the unit of replacement, it was necessary to use a plurality of redundancy decoders to perform replacement.

On the other hand, in a case in which the number of adjacent failed row addresses is smaller than the replacement unit, the replacement is made so as to include row addresses that are not failures that are adjacent to a given failed row address, thereby lowering the efficiency of redundancy memory cell usage.

SUMMARY OF THE INVENTION

A semiconductor device memory device according to the present invention has in each redundancy decoder a means for programming bank that redundancy decoder will be replacing the failures in, and a means for programming how many address lines will be replaced by that redundancy decoder.

That is, the semiconductor device has a plurality of normal memory cells, a means for activating the above-noted normal memory cells in response to an address that is applied from outside, a plurality of redundant memory cells, a first storage means for storing an address of a failed memory cell within the above-noted normal memory cells, a means for comparing the above-noted externally applied address with the address of the failed memory cell, a means for activating the above-noted redundant memory cell in response to an output of the above-noted comparison means or the means for activating the above-noted redundant memory cell and a means of suppressing the activation of the above-noted normal memory cell.

The above-noted comparison means performs a comparison between part or all of the above-noted externally applied address with the above-noted stored address of the failed memory cell.

The above-noted semiconductor device can additionally have a second storage means which stores the number of compared bits or non-compared bits, the number of compared bits being variable, and a first transmission means which, based on an output of the comparison means, transmits the contents of the second storage means to the redundant memory cell activation means, and it is also possible for the semiconductor device to have an architecture that has divided memory cell arrays, such as banks which operate independently, each of the banks, i.e., the memory cell sub-arrays having a plurality of the above-noted redundant memory cells.

In addition, a semiconductor device according to the present invention has a third storage means which stores information as to which failed memory cell within the above-noted memory cell sub-array is to be replaced, the above-noted comparison means performing a comparison between the contents of the third storage means and a memory cell array selection signal that is externally applied, a plurality of fourth storage means which, in response to the results of each of the comparison means, store which redundant memory cell in each one of the banks is to replace which failed memory cell in each of the sub-arrays of memory cells in each of the banks, and a second transmission means which, based on an output of the above-noted comparison means, transmits the contents of the fourth storage means to the above-noted memory cell activation means.

In addition, the above-noted fourth storage means can be made up of N-digit binary storage means, capable of storing combinations of the second powers of N, the second transmission means being connected to the plurality of fourth storage means, and this can be implemented by a wire-OR node that transmits an N-digit binary number.

It is possible for the above-noted redundant memory cell activation means to have a decoding means for decoding the above second transmission means, and a means for latching a value or decoded value of the transmission means, and for the redundant memory cell activation means to have a selection means which selects a number of bits that is not the object of comparison indicated by the first transmission means from the bits that form the externally applied address, and which makes selection from the remaining bits of the second transmission means.

DETAILED DESCRIPTION OF THE PREFERRED EMBODIMENTS

Figure 1:
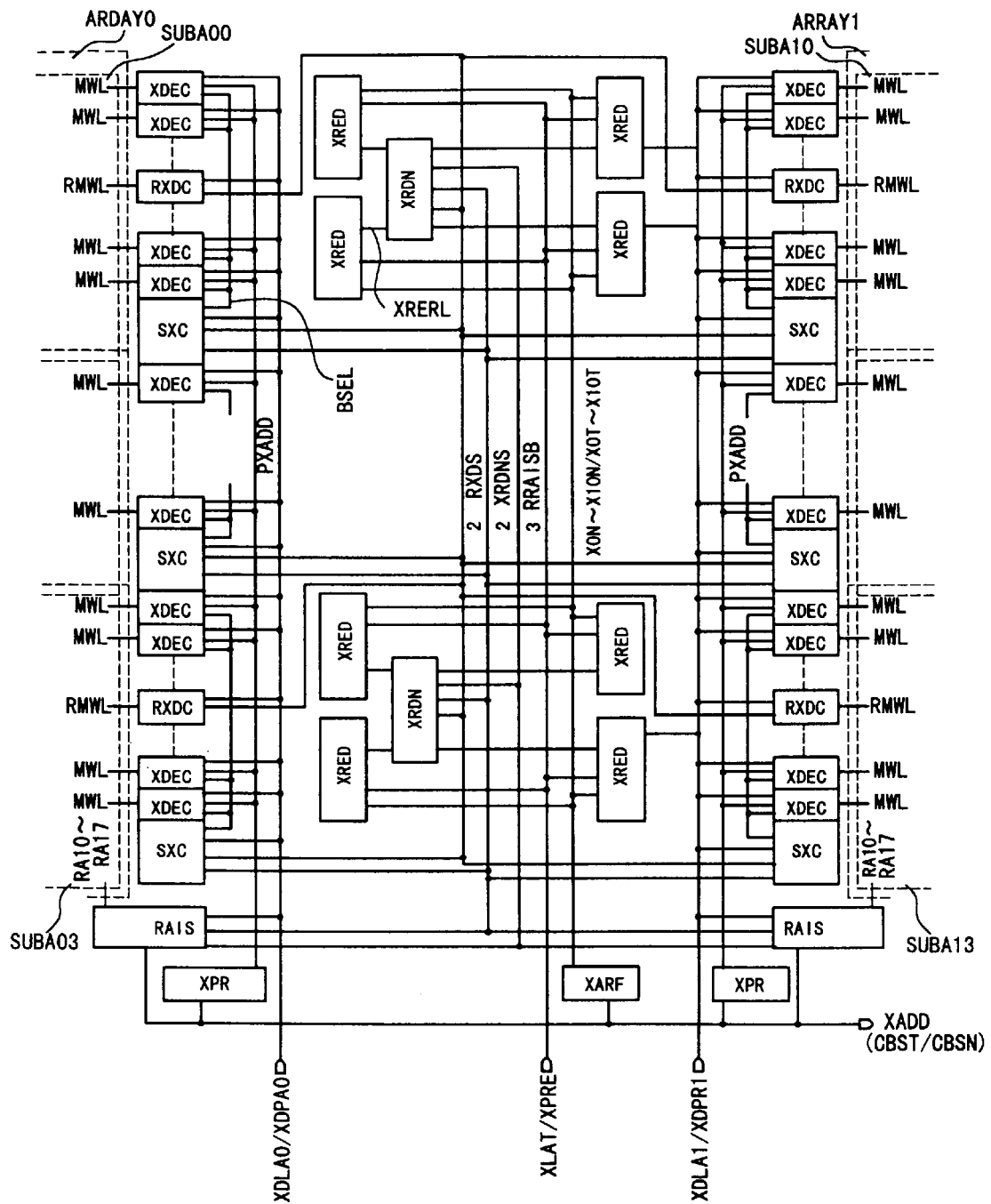
FIG. 1 is a block diagram which shows the first embodiment of the present invention.

Embodiments of present invention are described below, with reference being made to the relevant accompanying drawings.

The present invention basically has the technical conception in that a semiconductor memory device comprises a plurality of normal memory cells, a means for activating said memory cells (XDEC) in response to an externally applied address, a plurality of redundant memory cells, a memory and comparison means (XRED) comprising a first means for storing an address of a failed memory cell existing within said plurality of normal memory cells and a means for comparing said externally applied address with said failed memory cell address, and a means (RXDC) for activating said redundant memory cell, responsive to an output of said comparison means, wherein said comparison means performs a comparison of said failure memory cell address which is stored in said first memory, with at least a part of the bits that make up said externally applied address.

In the semiconductor memory device of the present invention, said means (RXDC) for activating said redundant memory cell further comprises a means for suppressing activation of said normal memory cell.

On the other hand, as the separate embodiment of the present invention, the semiconductor memory device comprises a plurality of normal memory cells, a means for activating said memory cells (XDEC) in response to an externally applied address, a plurality of memory and comparison cells, a redundant memory means (XRED) comprises a first means for storing an address of a failed memory cell existing within said plurality of normal memory cells and a means for comparing said externally applied address with said failed memory cell address, a redundant memory cell selection means (XRDN) for selecting a redundant memory cell in response to an output signal output from said memory and comparison means (XRED), and a means (RXDC) for activating said redundant memory cell, responsive to an output of said comparison means, In the semiconductor memory device of the present invention, said plurality of normal memory cells may form a main memory cell array and said main memory cell array is divided into a plurality of sub memory arrays each one of said sub memory arrays includes a plurality of normal memory cells and further each one of said sub memory arrays may comprise a plurality of memory and comparison means (XRED) with respect to each one of said redundant memory cells, at least one redundant memory cell selection means (XRDN) and at least one said redundant memory cell activating means (RXDC).

On the other hand, in the present invention, each one of said redundant memory cell activating means (RXDC) can be constituted so as to connect to any one of a plurality of said redundant memory cell selection means (XRDN), each of which is provided in each one of a plurality of sub-memory arrays constituting a main memory array, and further each one of said redundant memory cell selection means (XRDN) can be constituted so as to connect to any one of a plurality of said redundant memory cell activating means (RXDC), each of which is provided in each one of a plurality of sub-memory arrays constituting a main memory array.

In the present invention, one of said redundant memory cell activating means (RXDC) provided in one sub-memory array can be connected to a redundant memory cell selection means (XRDN), provided in another sub-memory array being different from the above-mentioned sub-memory array and further one of said redundant memory cell selection means (XRDN) provided in one sub-memory array can be connected to a redundant memory cell activating means (RXDC) provided in another sub-memory array being different from the above-mentioned sub-memory array.

Moreover, in the present invention, said redundant memory cell selection means (XRDN) serving as a redundancy decoder means, may comprise a means for programming that which redundant memory cell should be replaced for a failure memory cell and a means for programming that how many number of said failure memory cells should be replaced by said redundant memory cells, simultaneously.

In the semiconductor memory device of the present invention, said redundant memory selection means (XRDN) may select a number of failure memory cells to be replaced by said redundant memory cell, from a group consisting of the numbers of 1, 2 and 4, and also the number of bits to be compared by said comparison means can be varied, and further the semiconductor memory device of the present invention, may comprise a second means for storing the number of bits to be compared or not compared by said comparison means and a first means for transmitting, based on said output of said comparison means, the contents of said second storage means to said redundant memory cell activation means.

Further in the semiconductor memory device, said semiconductor memory device may comprise at least two separated bank structures, each comprising a plurality of said memory cells which forms a main memory cell array which being divided into a plurality of sub memory arrays each one of said sub memory arrays including a plurality of normal memory cells, and each one of said banks operates in accordance with an externally applied address signal, and further wherein each one of said separated bank structures comprises a plurality of redundant memory cells, respectively.

And in that each of said banks may comprise a plurality of memory and comparison means (XRED), a plurality of redundant memory cells selection means (XRDN) and a plurality of said redundant memory cell activating means (RXDC).

In the semiconductor memory device of the present invention, at least one of said redundant memory cells selection means (XRDN) provided in one of said banks can be connected to one of said redundant memory cell activating means (RXDC) which is provided in a separate bank as the one in that said redundant memory cells selection means (XRDN) is provided and further in that at least one of said redundant memory cell activating means (RXDC) provided in one of said banks can be connected to one of said redundant memory cells selection means (XRDN) which is provided in a separate bank as the one in that redundant memory cell activating means (RXDC) is provided.

On the other hand, in the present invention, the semiconductor memory device further comprises a third means for storing information as to which failed memory cell of what memory cell array of said separated bank is to be replaced, and said comparison means performing a comparison between the contents of said third storage means and an externally applied memory array selection signal.

Moreover, the semiconductor memory device of the present invention, further comprises a plurality of fourth means for storing, in response to said comparison means, which redundant memory cell in which sub-memory cell array of said separated bank is to be replaced with which failed memory cell, and a second means for transmitting, based on an output of said comparison means, the contents of said fourth storage means to said redundant memory cell activation means.

More specific embodiments of the present invention will be explained hereunder with reference to the attached drawings.

Figure 2:
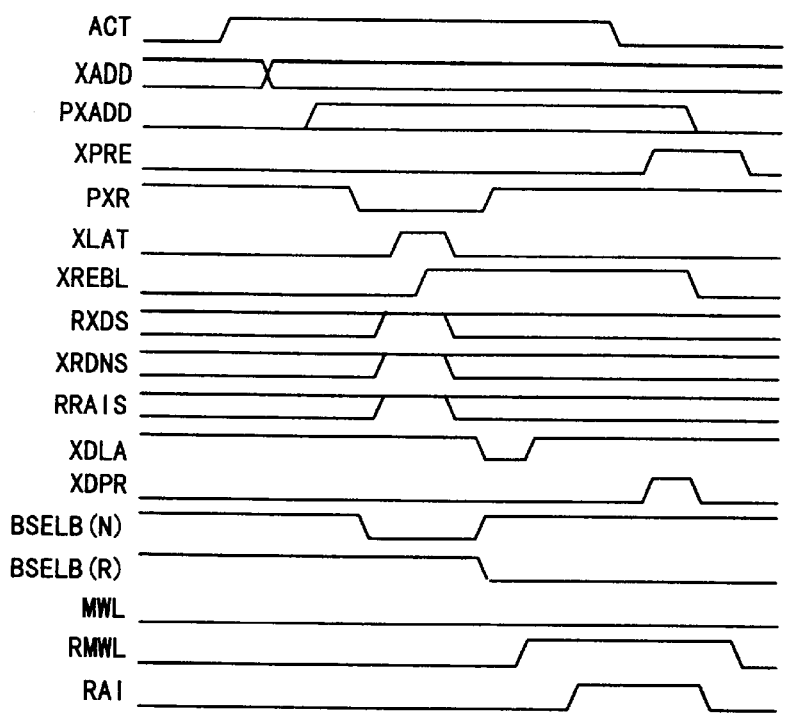
FIG. 2(a) is a timing diagram of the first embodiment for the case of a selected failure address.
FIG. 2(b) is a timing diagram of the first embodiment for the case of an unselected failure address.
Figure 2:
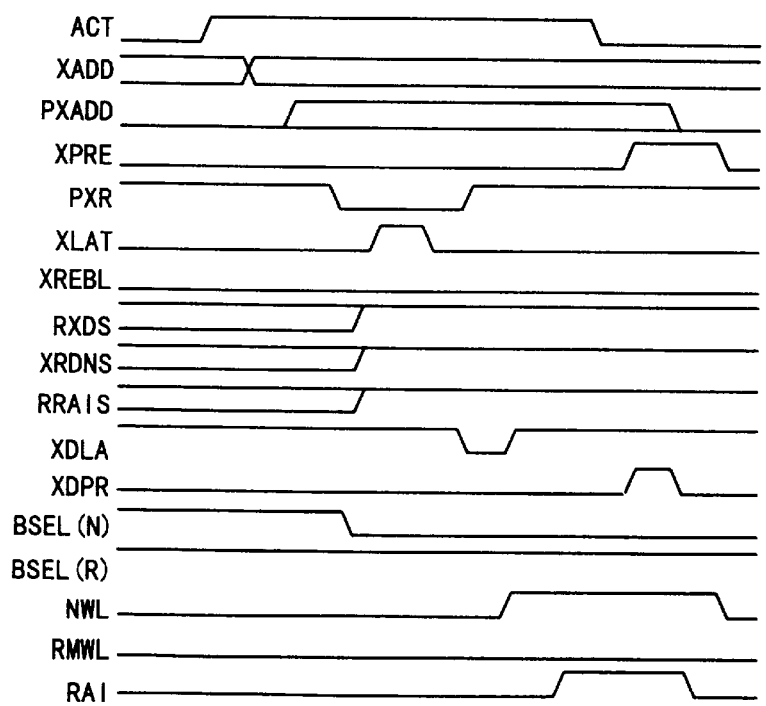

FIG. 1 is a block diagram of the first embodiment of the present invention, and FIG. 2(a) and (b) are timing diagrams which illustrate the operation thereof.

FIG. 2(a) is the case in which a redundant memory cell is selected, and FIG. 2(b) is the case in which a redundant memory cell is not selected. Unless otherwise noted other signals operate the same as in the prior art.

The following description is for the same case as used with regard to the prior art, in which the number of banks is 2 (these being ARRAY0 and ARRAY1), the number of sub-array in each bank is 4 (these being SUBA00 through SUBA3, and SUBA10 through SUBA13), and the total number of sub-word lines included in the device is 512, the number of sub-arrays each contains a certain amount number of sub-word lines therein is not shown, though.

The description will make use of the hierarchical work line architecture.

In presenting this description, the number of sub-word lines with respect to 1 main word line MWL will be taken as 8 lines.

Therefore, the row addresses of each of the banks have 11 bits (X0 through X10), of which X9 through X10 are the sub-array, X3 through X8 are the main word lines within the sub-array, and X0 through X2 distinguish between the 8 sub-word lines with respect to each main word.

The replacement of a failed memory cell with a redundant memory cell is performed by one row or four row address lines, which are distinguished by X0 and X1. Each sub-array has 1 redundant main word line RMWL and 8 sub-word lines that are connected thereto. Note, however, that these numbers themselves are not restrictions that are imposed by the present invention.

The operation of the present invention will be described below, with reference being made to the circuit diagram and the timing diagrams. In FIG. 1 XADD, which is made up of 11 bits, is the row address signal, this being captured from an external input into an address buffer (not shown in the drawing), in accordance with the ACT signal.

CBS is a bank selection signal, this being captured from outside by a command decoder, for example (not shown in the drawing).

XABF is a row address signal buffer circuit, this circuit generating the complimentary signals X0N through X10N and X0T through X10T in accordance with the XADD signal, and generating the complimentary signals CBST and CBSN in accordance with the CBS bank selection signal. XRED is a failure address storage and comparison circuit. Each XRED circuit stores the bank and failure address to be replaced.

Figure 3:
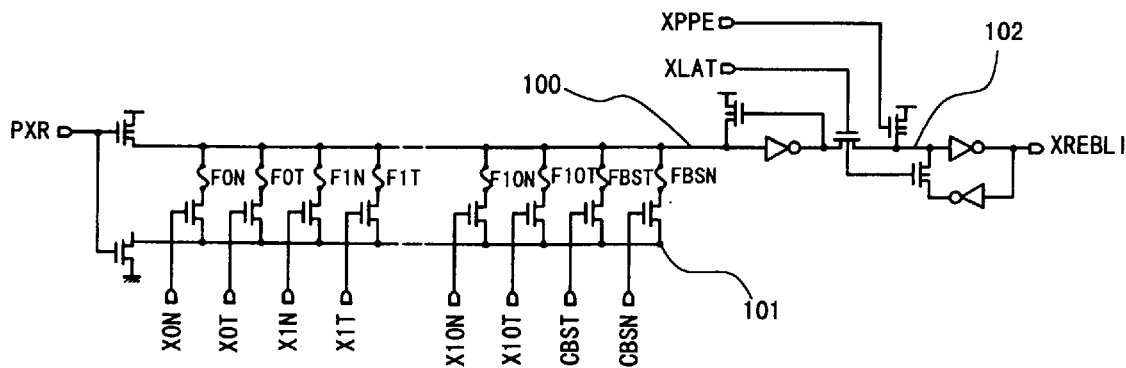
FIG. 3 is circuit diagram which shows an example of the XRED circuit of FIG. 1.

FIG. 3 is a circuit diagram which shows an example of the XRED redundancy decoder, this circuit performing a comparison between the row address signal XADD and a failure cell address that is stored internally.

Each XRED circuit stores a failure cell address and bank to be replaced.

In the case in which this replacement includes a plurality of row addresses, it stores one of that group of addresses. In all cases, it is capable of storing a sufficient number of bits to enable discrimination of the minimum unit of replacement.

In this embodiment, to enable a minimum replacement unit of 1 row address, it is possible to store all the bits X0 through X10 that make up the XADD signal.

In this circuit, the replacement address is stored by blowing the fuses F0N through F10N and F0T through F10T. The bank to be replaced is stored by blowing the fuses FBSN and FBST. While there is no particular restriction on the method of blowing a fuse, the generally used method is that of blowing a fuse with a laser beam.

Storage is made of one bit, which indicates which fuse, of FnN and FnT replacement addresses, is blown. For example, if the replacement addresses is 0, F0N through F10N and FBSN are blown, and F1T through F10T and FBST are not blown.

Additionally, in the case in which a plurality of addresses are to be replaced, no fuse that stores the lower-order bit address of XADD is blown. For example, if the addresses to be replaced are 0 and 1, F1N through F10N are blown, while F0N and F0T through F10T are not blown. In this case, X0 is not stored.

The operation of this circuit is described as follows.

First, the bits of XADD all become low level, the PXR signal changes to low level and the node 100 changes to high level. Then, based on an externally input address signal, the complimentary signals X0N through X10N and X0T through X10T, which make up the 11 bits XADDR address signal and the bank selection signals CBSN and CBST are set.

When doing this, because these signals are complimentary, one is high level, while the other is low level. For example, if the row address is 0 and the bank is 0, X0N through X10N and CBSN are at the high level, and X0T through X10T and CBST are at the low level.

Therefore, unless not only does a replacement address stored in the fuses FnN and FnT coincide with the XADD signal, but also the selected bank signal CBS coincides with the bank to be replaced, which is stored in the fuses FCBN and FCBT, the nodes 100 and 101 are maintained in connection with one another.

With regard to bits for which neither FnN nor FnT is blown, there will be no connection made between node 100 and node 101, regardless of the states of XnN and XnT, the result being that these bits will be excluded from the address comparison, and will always be recognized as replacement addresses when other bit coincide.

At this point, if the PXR signal is high level and the above-noted comparison does not indicate coincidence, the node 100 changes to the low level, but is held at the high level if the comparison result is coincidence. This is held at node 102 by means of the latch signal XLAT, and is output as the XREBL signal.

Figure 4:
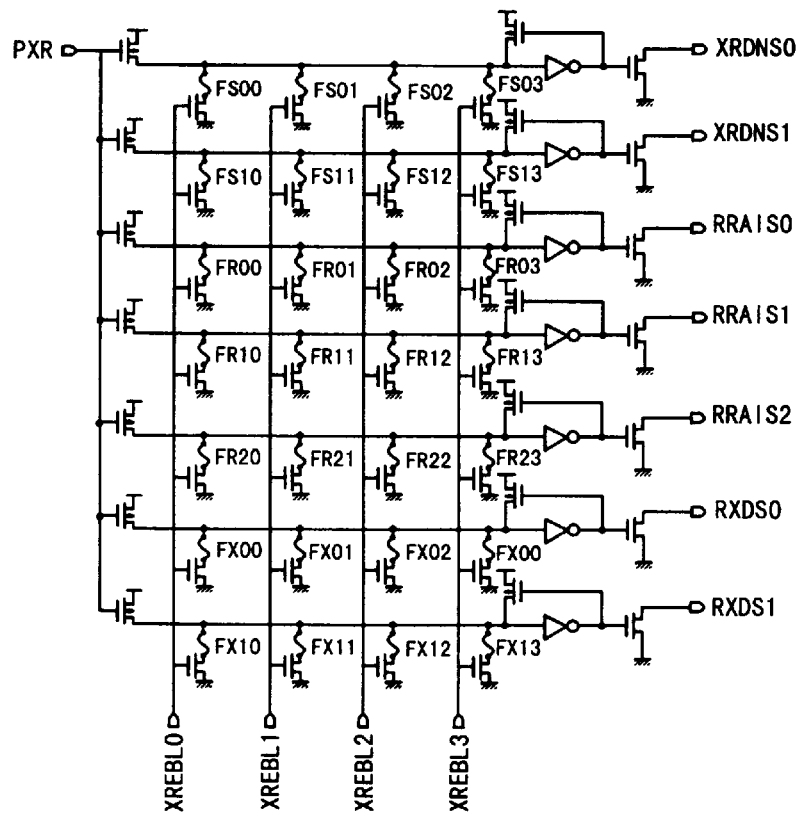
FIG. 4 is a circuit diagram which shows an example of the XRDN circuit of FIG. 1.

FIG. 4 is a circuit diagram which shows an example of an XDRN circuit.

The XRDN circuit is a redundant memory cell selection circuit, and in the case being described there is 1 XRDN circuit with respect to each 4 XRED circuits.

Note, however, that the present invention does not impose any restrictions with regard to these numbers.

FIG. 4 is a circuit diagram which shows an example of the XRDN circuit which is shown in FIG. 1. If one of the 4 XREBL signals that are connected to the XRDN circuit changes to high level, the XRDNS0 and XRDNS1 signals, which are at high level in accordance with a pre-charge circuit (not shown in the drawing) are selectively dropped, in accordance with the fuses FS00 through FS13.

The XRDNS signals are signals which indicate the selected redundant memory cell. In the case in which the number of lines to be replaced is indicated and XRDNS0 and XRDNS1 are both high level, a redundant memory cell is not selected, and replacement is performed.

If, however, the XRDNS0 and XRDNS1 signals are low level and high level, respectively, replacement is performed of 1 sub-word line, if they are high level and low level, respectively, replacement is performed of 2 sub-word lines, and if they are both low level, replacement is performed of 4 sub-word lines.

The signals RXDS0 and RXDS1, which are at the high level because of a pre-charge circuit (not shown in the drawing), are pulled down in accordance with the fuses FX00 through FX13. RXDS0 and RXDS1 are signals which select the redundant main word line and sub-array that contains that line.

Additionally, the RRAIS1 and RRAIS2 signals, which are at a high level because of a pre-charge circuit (not shown in the drawing) are pulled down in accordance with the fuses FR0 through FR1. The RRAIS1 and RRAIS2 signals select the sub-word selection signal RAI.

All signals are maintained at the high level unless there is a coincidence result from a comparison at one XRED circuit.

The XRED and XRDN circuits are not assigned in a fixed manner to particular banks, but rather operate regardless of the selected bank. Therefore, the PXR, XLAT, XPRE, RXDS XRDNS, and RRAIS signals are also shared between banks, and operate regardless of what bank has been activated.

In FIG. 1, XPR denotes a row address pre-decoder, which generates a row address pre-decode signal PXADD from the row address signal XADD.

In the case being described, PXADD is made up of the 8 signals X3N4N5N through X3T4T5T that are pre-decoded form X3 through X5, the 8 signals X6N7N8N through X6T7T8T that are pre-decoded form X6 through X8, and the 4 signals X9N10N through X9T10T that are pre-decoded from X9 and X10.

The 8 signals X3T4T5T and 8 signals X6T7T8T and so forth are used for XDEC selection within each of the sub-arrays, while the 4 signals X9T10T and so forth are used for sub-array selection in the SXC circuit.

Figure 5:
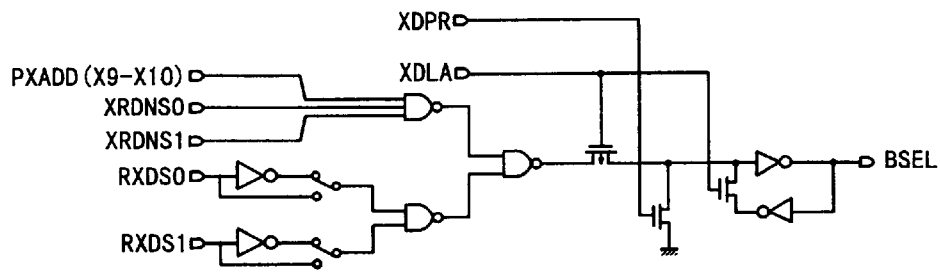
FIG. 5 is a circuit diagram which shows an example of the SXC circuit of FIG. 1.

FIG. 5 is a circuit diagram which shows an example of an SXC circuit.

The SXC circuit is a sub-array selection circuit which, when XADD does not coincide with all the failure cell replacement addressees stored in XRED and the RXDS0 and RXDS1 signals remain at the high level, decodes the PXADD signal (X9 and X10) and performs latching thereof by the XDLA signal and, based on this, activates a sense amplifier column included in a sub array (not shown in the drawing), and also activates the sub-array signal BSEL.

In the case in which XADD coincides with some failure cell replacement address that is stored in XRED and the RXDS signal is at the low level, each SXC decodes an XRDNS signal and latches it by means of an XDLA signal, thereby activating the sense amplifier column specified by the XRDNS signal.

When doing this, in the case in which the sub-array that is specified by PXADD does not coincide with the sub-array that is specified by XRDNS, the activation of a redundant main word line within the sub-array indicated by PXADD and of the sense amplifier column is suppressed.

In either case, the activated sense amplifier column is included in the sub-array that includes the activated word line.

Figure 6:
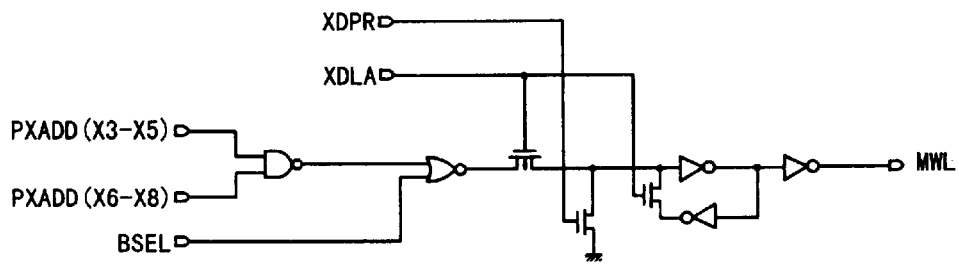
FIG. 6 is a circuit diagram which shows an example of the XDEC circuit of FIG. 1.

FIG. 6 is a circuit diagram which shows an example of an XDEC circuit.

The XDEC circuit is a row decoder, which latches the PXADD signal (X3 through X8) and the BSEL signal by means of the XDLA signal, this being used as the basis for activating a main word line.

Note that in the case in which XADD coincides with a replacement address that is stored in any one of XRED and RXDS is at the low level, this activation is not done. When the ACT signal changes to low level, all the MWL (main word lines) are unselected by the XDPR signal.

Figure 7:
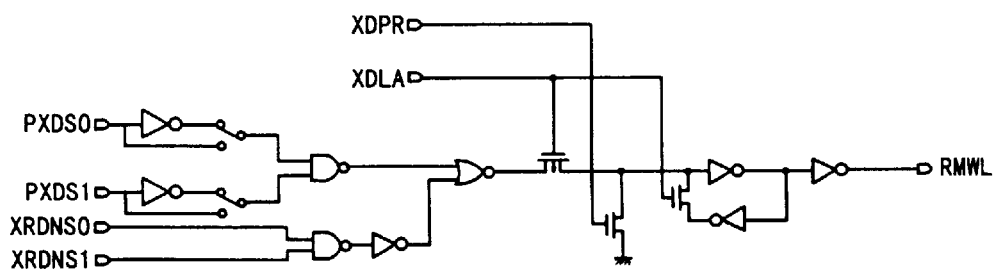
FIG. 7 is a circuit diagram which shows an example of the RXDC circuit of FIG. 1.

FIG. 7 is a circuit diagram which shows an example of an RXDC circuit.

The RXDC circuit is a redundant row decoder which, in the case in which XADD coincides with a replacement address that is stored in any one of XRED and the RXDS signal is at the low level, activates a redundant main word line, based on the XRDNS signal. When the ACT signal changes to low level, all the RMWL (redundant main word lines) are unselected by the XDPR signal.

Figure 8:
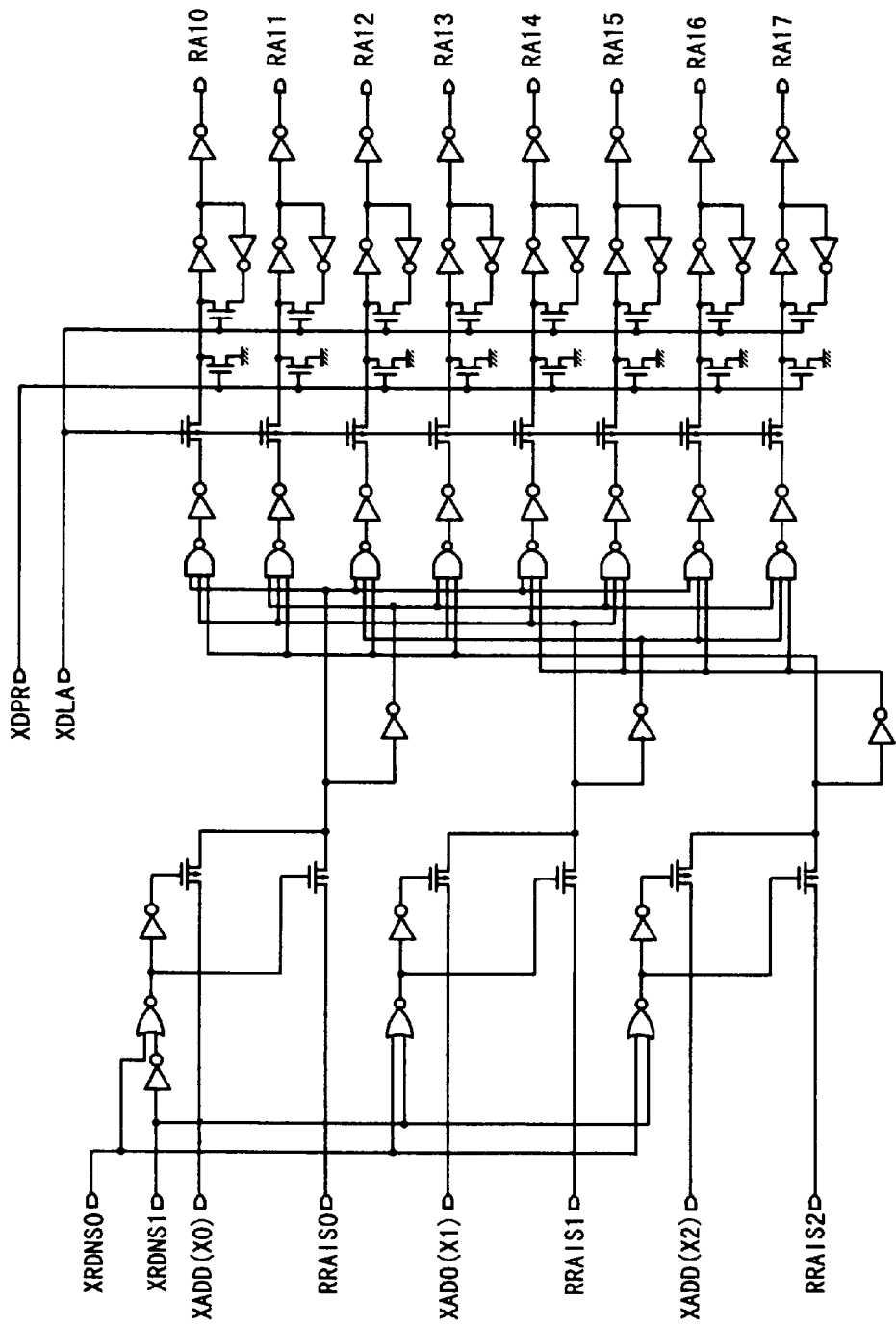
FIG. 8 is a circuit diagram which shows an example of the RAIS circuit of FIG. 1.

FIG. 8 is a circuit diagram which shows an example of an XDEL circuit.

The RAIS circuit selects a sub-word line selection signal RAI in accordance with the row address pre-decoding signal PXADD, RRAIS, and RXDS signals.

In the case in which XADD agrees with no replacement address that is stored in any one of XRED and the RXDS signal is at the high level, only 1 line of RAI0 through RA17 is activated in accordance with XADD(X0 to X2).

If, however, XADD coincides with a replacement address stored in any one of XRED and at least one of the RXDS0 and RXDS1 signals is at the low level, RRAIS is also followed.

In the case in which only XRDNS0 is low level (that is, the case of 1 replacement), one line of RAI0 through RA17 is selected by the RRAIS0 signal in place of X0 of XADD, by the RRAIS1 signal in place of X1 of XADD, and by the RRAIS2 in place of X2 of XADD.

In the case in which only XRDNS1 is low level (that is, the case of 2 replacements), one line of RAI0 through RA17 is selected by the RRAIS1 signal in place of X1 of XADD, by the RRAIS2 signal in place of X2 of XADD, and by X0 of XADD.

In the case in which both XRDNS0 and XRDNS1 are low level (that is, the case of 4 replacements), one line of RAI0 through RA17 is selected by the RRAIS2 in place of X2 of XADD, and by X0 and X1 of XADD.

The result of the above is latched by the XDLA signal. When the ACT signal changes to low level, all the RAI signals are unselected by the XDPR signal.

The main word lines MWL and sub-word line selection signals RAI are input to a sub-word driver circuit (not shown in the drawing). The logical AND thereof is used to select the sub-word line SWL. The sub-word line SWL is directly connected to the memory cell, thereby activating it.

When the ACT signal changes to the low level, because the XDPR signal unselects all the MWLs and RAI signals, the sub-word lines SWL are also unselected.

In this embodiment of the present invention, programming by blowing fuses establishes what replacement addresses of what banks are to be stored and compared by each of the XREDs.

In the case described, there are 4 redundant main word lines for each bank and 32 sub-word lines corresponding thereto, as is the case of the prior art example, and there are 32 XREDs for 2 banks (the same number as within the chip in the prior art example).

Therefore, in the case in which all the XREDs are used for bank 0 and the replacement done by each is limited to 1 replacement (corresponding to single bit failures and open sub-word lines), it is possible to repair up to 32 locations within a bank.

Therefore, if there is some concentration of the occurrences of failures between banks, the failure repair efficiency will be improved.

For a sub-word line having 4 addresses that share an address other than X0 and X1, replacement is possible by a single XRED, only.

Thus, if for example a main word line (corresponding to 8 sub-word lines that share an address other than X0 through X2) fails, replacement of 8 sub-word lines is done using 2 XREDs.

In this case, if 8 XREDs are used, it is possible to repair 4 main word lines (32 sub-word lines) per bank. Because there are only 4 redundant main word lines per bank, although further repair of bank 0 is not possible, with respect to bank 1, it would be possible to repair up to 24 locations using the remaining 24 XREDs.

Therefore, there is also an improvement in the failure repair efficiency in the case in which a failure is composed of a plurality of failure addresses that are contiguous.

As described above in detail, according to the present invention, because it is possible to efficiently use redundant memory cell existing in each bank, even in the case in which there is a concentration of failures in a bank, compared with the prior art, for a given number of XRED circuits and redundant memory cells, the repair efficiency is high, making it possible to improve the yield without greatly increasing the chip surface area.

Figure 9:
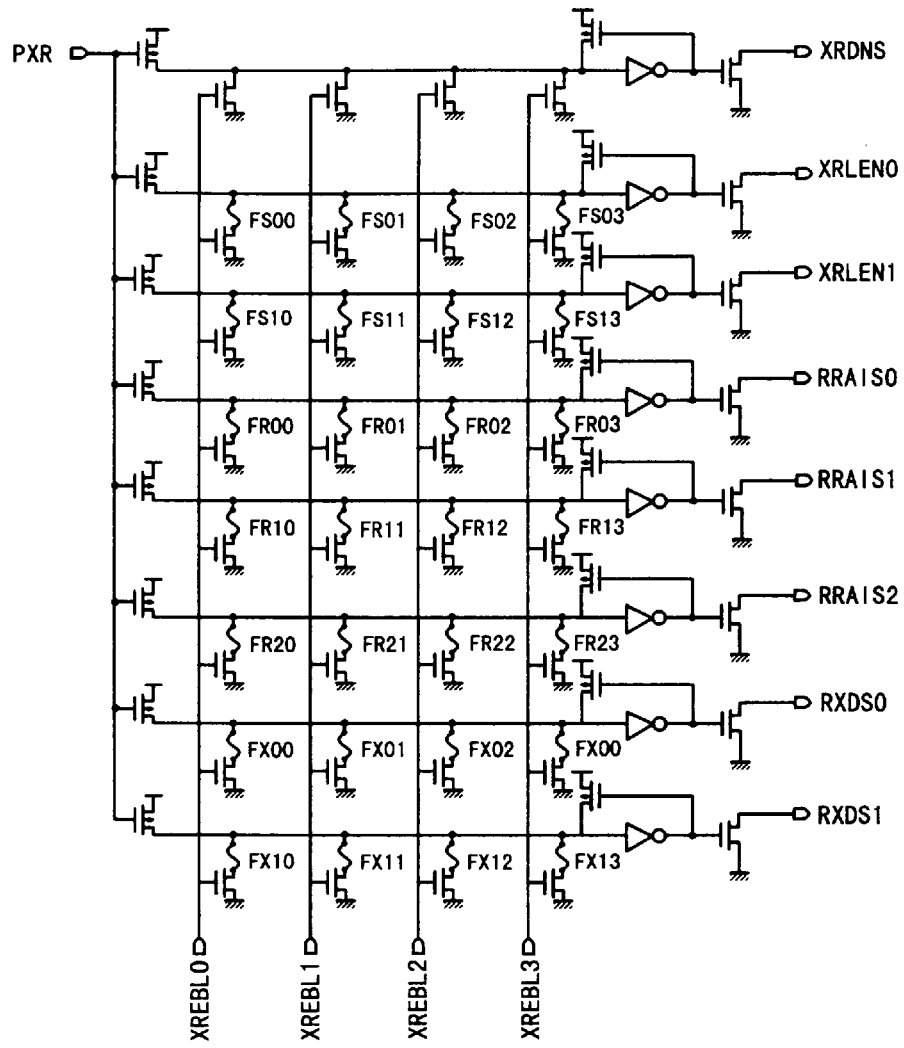
FIG. 9 is a circuit diagram which shows an example of an XRDN circuit of the second embodiment of the present invention.
Figure 10:
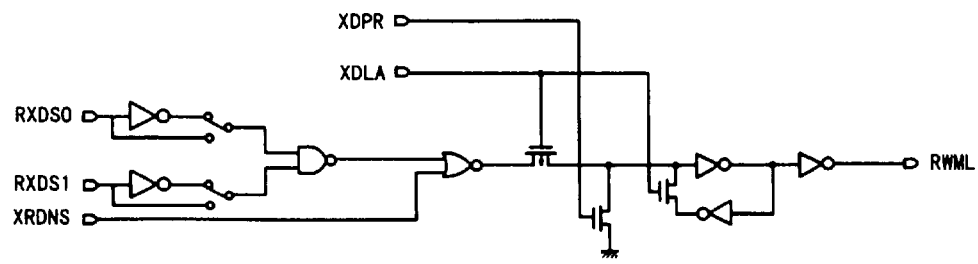
FIG. 10 is a circuit diagram which shows an example of an RXDC circuit of the second embodiment of the present invention.
Figure 11:
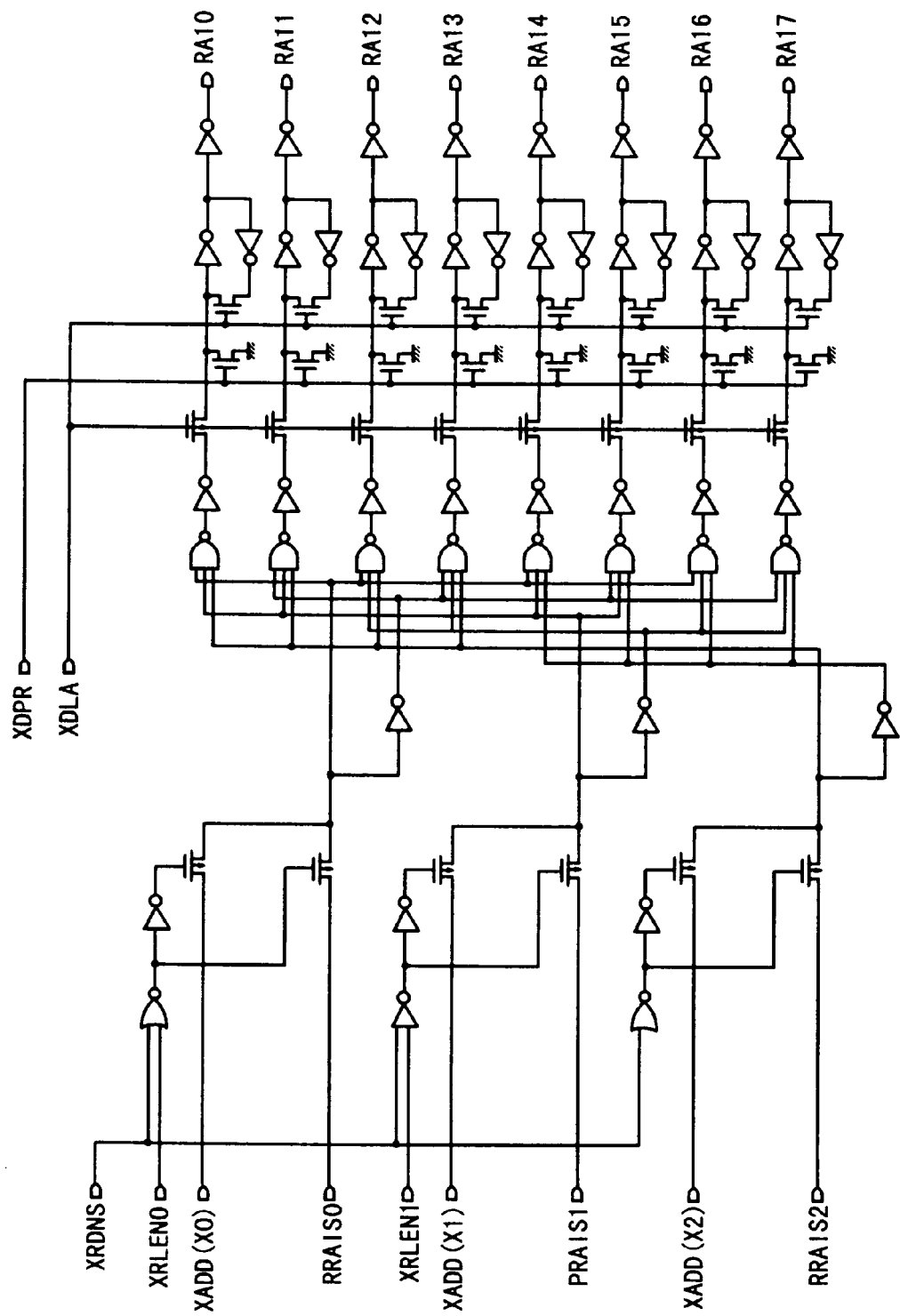
FIG. 11 is a circuit diagram which shows an example of an RAIS circuit of the second embodiment of the present invention.
Figure 12:
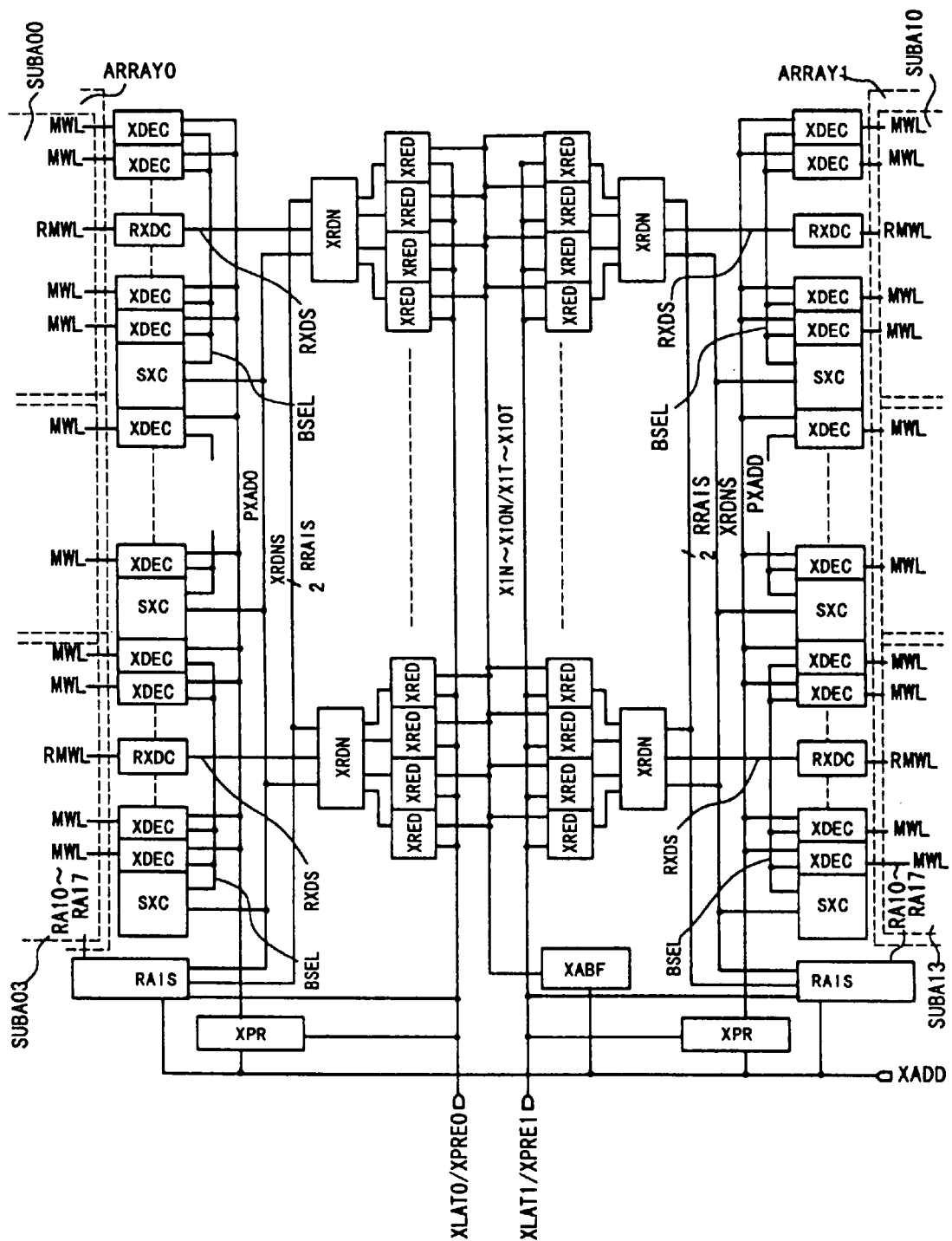
FIG. 12 is a block diagram of the prior art.
Figure 13A:
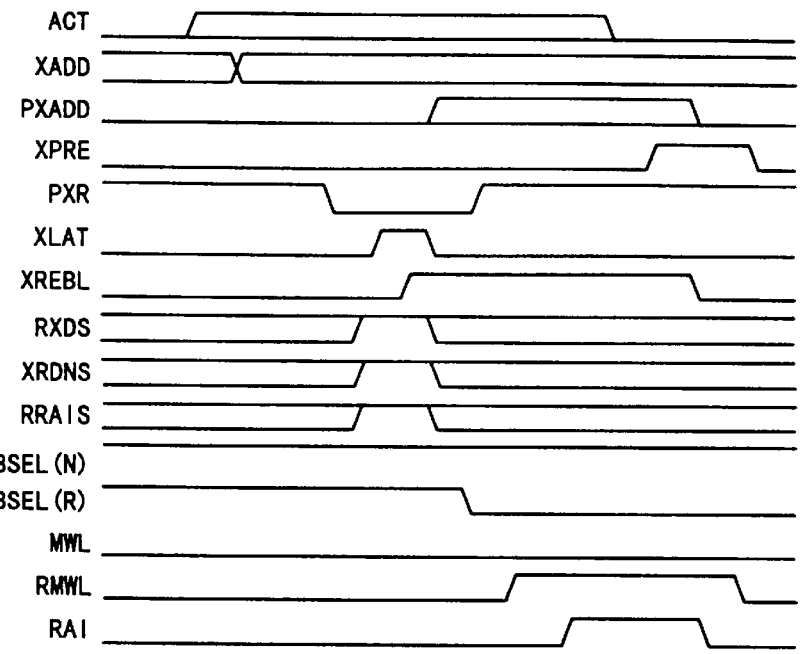
FIG. 13(a) is a timing diagram of the prior art for the case of a selected failure address.
Figure 13B:
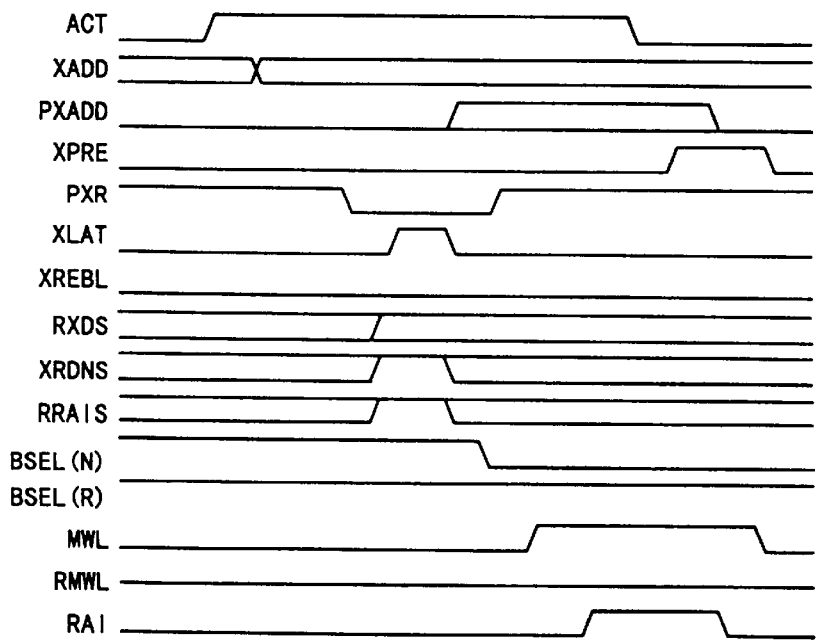
FIG. 13(b) is a timing diagram of the prior art for the case of an unselected failure address.
Figure 14:
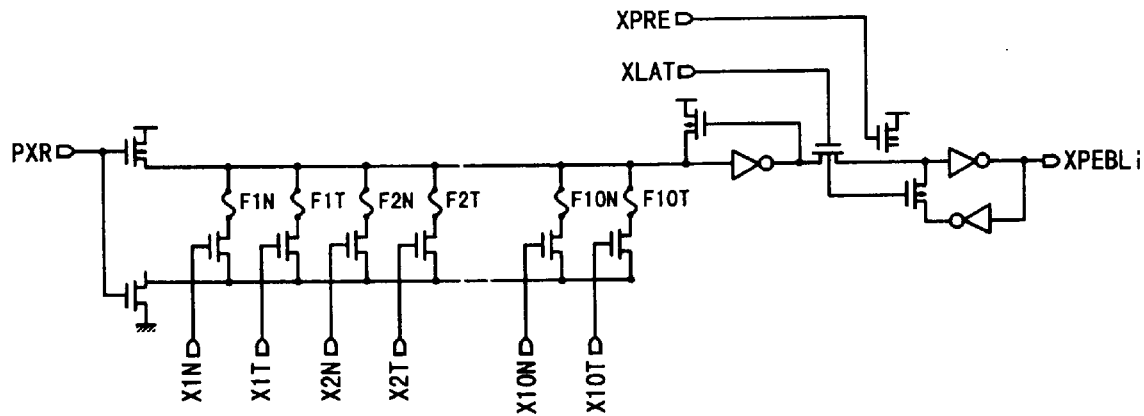
FIG. 14 is a circuit diagram which shows an example of the XRED circuit of FIG. 9.
Figure 15:
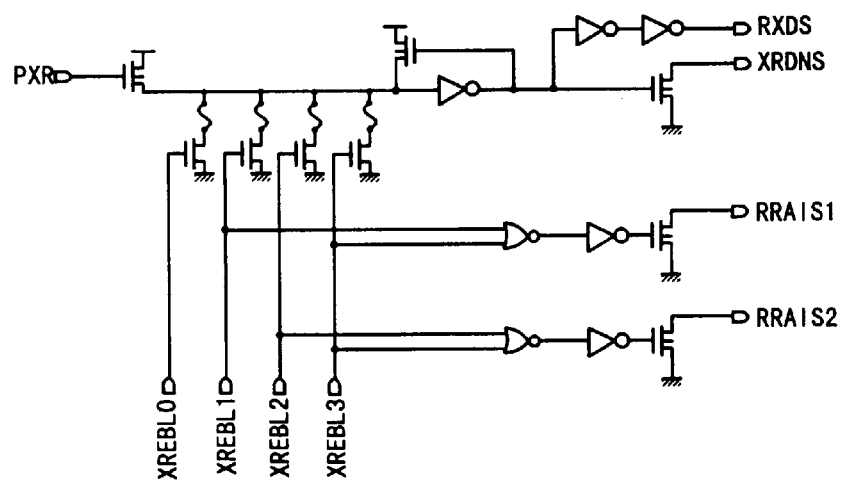
FIG. 15 is a circuit diagram which shows an example of the XRDN circuit of FIG. 9.
Figure 16:
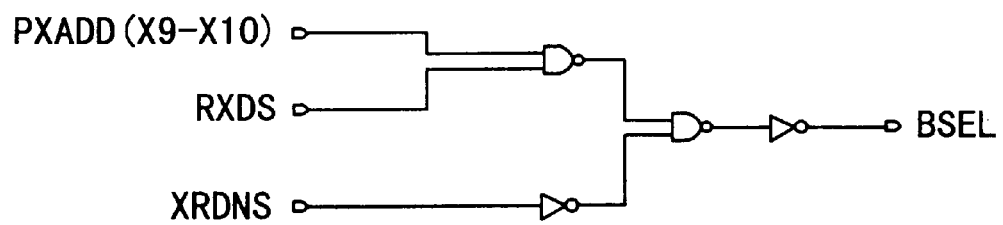
FIG. 16 is a circuit diagram which shows an example of the SXC circuit of FIG. 9.
Figure 17:
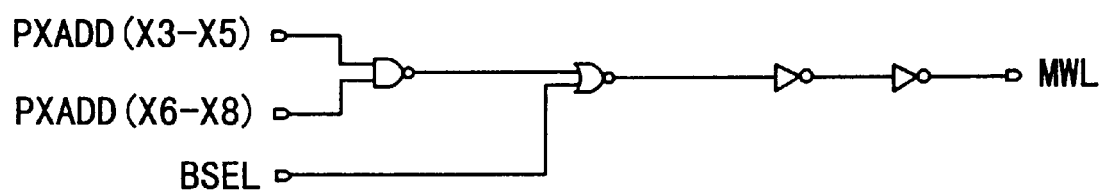
FIG. 17 is a circuit diagram which shows an example of the XDEC circuit of FIG. 9.
Figure 18:
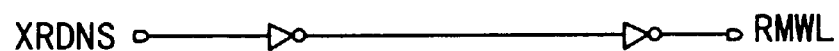
FIG. 18 is a circuit diagram which shows an example of the RXDC circuit of FIG. 9.
Figure 19:
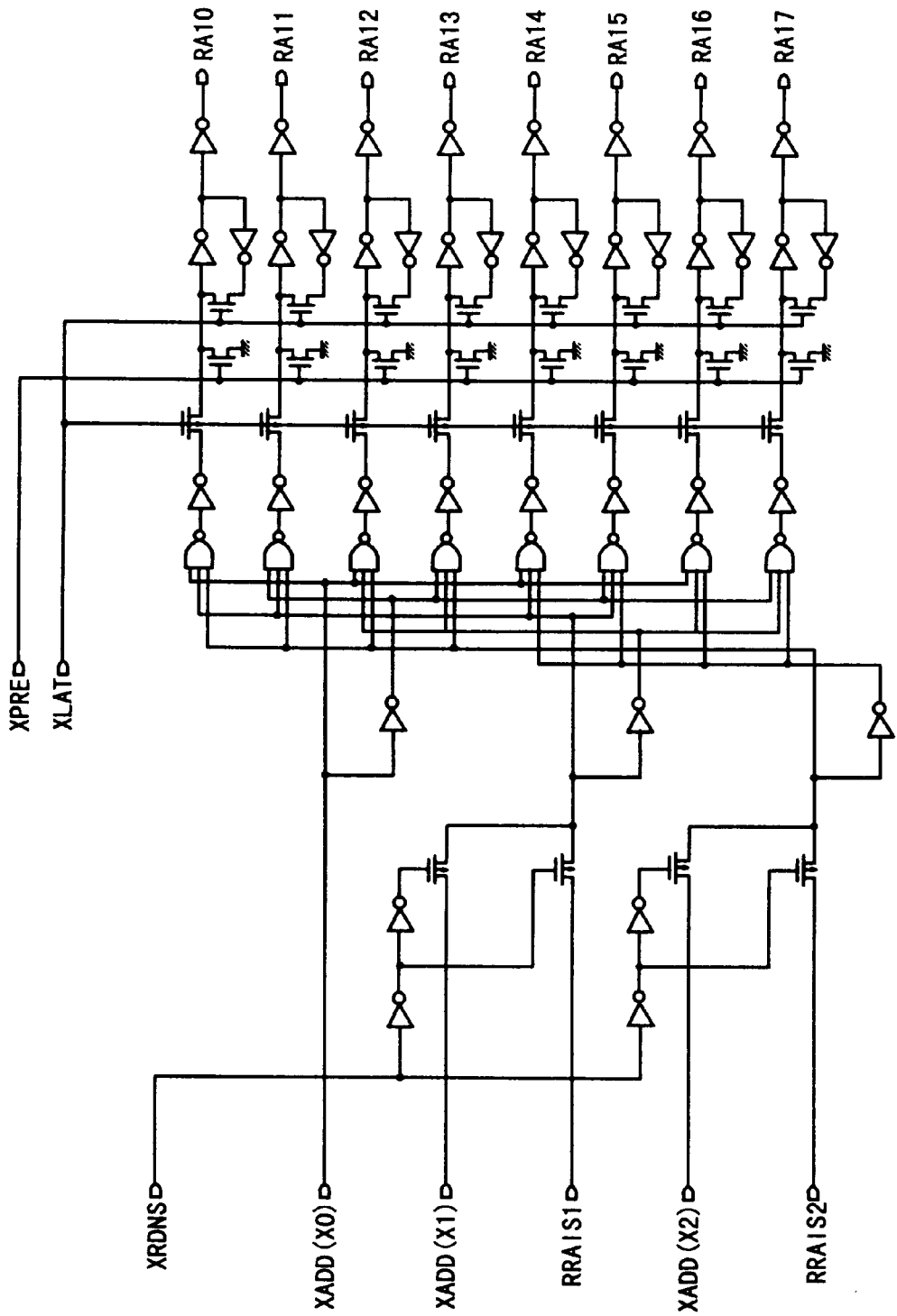
FIG. 19 is a circuit diagram which shows an example of the RAIS circuit of FIG. 9.

FIG. 9 is a circuit diagram which shows the XRDN circuit of the second embodiment of the present invention, FIG. 10 is a circuit diagram which shows the RXDC circuit of the second embodiment, and FIG. 11 is a circuit diagram which shows the RAIS circuit of the second embodiment.

In the previously described first embodiment, the signals XRDNS0 and XRDNS1 which indicated the selected redundant memory cell served also to indicate the number of replacements.

In the second embodiment, these two functions are separated, the selection of a redundant memory cell being indicated by the XRDNS signal, and an XRLEN0 and XRLEN1 signal being used to indicate the number of replacements.

In doing this, in the case in which the XRLEN0 and XRLEN1 signals are both low level, replacement is performed of 1 sub-word line.

If the signals are high level and low level, respectively, replacement is performed of 2 sub-word lines. If the signals are low level and high level, respectively, replacement is performed of 4 sub-word lines. In this embodiment, It is only necessary to examine the XRDNS signals to judge the selection of redundant memory cells in the RXDC, thereby resulting in a simplification of the circuit.

As described above, the present invention enables highly efficient use of redundant memory cells existing within each memory bank, thereby providing a semiconductor memory device with a high yield, while limiting the increase in the chip surface area.

What is claimed is:

1. A semiconductor memory device comprising:

a plurality of normal memory cells;

means for activating said memory cells (XDEC) in response to an externally applied address;

a plurality of redundant memory cells;

memory and comparison means (XRED) comprising first means for storing an address of a failed memory cell existing within said plurality of normal memory cells and means for comparing said externally applied address with said failed memory cell address;

redundant memory cell selection means (XRDN) for selecting any one of a plurality of said redundant memory cells in response to an output signal output from said memory and comparison means (XRED); and redundant memory cell activating means (RXDC) for activating said redundant memory cell, responsive to an output of said memory and comparison means.

2. A semiconductor memory device according to claim 1, wherein, said plurality of normal memory cells form a main memory cell array and said main memory cell array is divided into a plurality of sub memory arrays each one of said sub memory arrays includes a plurality of normal memory cells.

3. A semiconductor memory device according to claim 2, wherein, each one of said sub memory arrays comprises a plurality of memory and comparison means (XRED) with respect to each one of said redundant memory cells, at least one redundant memory cell selection means (XRDN) and at least one said redundant memory cell activating means (RXDC).

4. A semiconductor memory device according to claim 2, wherein said semiconductor memory device comprises at least two separated bank structures, each comprising a plurality of said memory cells which forms a main memory cell array said main memory cell array being divided into a plurality of sub memory arrays, each one of said sub memory arrays including a plurality of normal memory cells, and each one of said banks operates in accordance with an externally applied address signal, and further wherein each one of said separated bank structures comprises a plurality of redundant memory cells, respectively.

5. A semiconductor memory device according to claim 4, wherein said device further comprises:

third means for storing information as to which failed memory cell of what memory cell array of said separated bank is to be replaced, and said memory and comparison means performing a comparison between contents of said third storage means and an externally applied memory array selection signal.

6. A semiconductor memory device according to claim 4, wherein each of said banks comprising plurality of memory and comparison means (XRED), a plurality of redundant memory cells selection means (XRDN) and a plurality of said redundant memory cell activating means (RXDC).

7. A semiconductor memory device according to claim 6, wherein at least one of said redundant memory cells selection means (XRDN) provided in one of said banks can be connected to one of said redundant memory cell activating means (RXDC) which is provided in a separate bank as the one in that said redundant memory cells selection means (XRDN) is provided.

8. A semiconductor memory device according to claim 6, wherein at least one of said redundant memory cell activating means (RXDC) provided in one of said banks can be connected to one of said redundant memory cells selection means (XRDN) which is provided in a separate bank as the one in that redundant memory cell activating means (RXDC) is provided.

9. A semiconductor memory device according to claim 8, said device further comprising:

a plurality of fourth means for storing, in response to said memory and comparison means, which redundant memory cell in which sub-memory cell array of said separated bank is to be replaced with which failed memory cell; and second means for transmitting, based on an output of said memory and comparison means, contents of said fourth storage means to said redundant memory cell activation means.

10. A semiconductor memory device according to claim 9, wherein said fourth storage means is configured as an N-digit binary storage means and is capable of storing combinations of the second powers of N.

11. A semiconductor memory device according to claim 9, wherein said second transmission means is connected so said plurality of fourth storage means and is formed by a wired-OR node that transmits an N-digit binary quantity.

12. A semiconductor memory device according to claim 9, wherein said redundant memory cell activation means comprises:

means for decoding said second transmission means; and means for latching a value or decoded value of said transmission means.

13. A semiconductor memory device according to claim 1, wherein each one of said redundant memory cell activating means (RXDC) is constituted so as to connect to any one of a plurality of said redundant memory cell selection means (XRDN), each of which is provided in each one of a plurality of sub-memory arrays constituting a main memory array.

14. A semiconductor memory device according to claim 13, wherein one of said redundant memory cell activating means (RXDC) provided in a first sub-memory array can be connected to a redundant memory cell selection means (XRDN), provided in a second sub-memory array.

15. A semiconductor memory device according to claim 1, wherein each one of said redundant memory cell selection means (XRDN) is constituted so as to connect to any one of a plurality of said redundant memory cell activating means (RXDC), each of which is provided in each one of a plurality of sub-memory arrays constituting a main memory array.

16. A semiconductor memory device according to claim 15, wherein one of said redundant memory cell selection means (XRDN) provided in a first sub-memory array can be connected to a redundant memory cell activating means (RXDC) provided in a second sub-memory array.

17. A semiconductor memory device according to claim 15, wherein said redundant memory cell selection means (XRDN) serving as a redundancy decoder means comprises means for programming which redundant memory cell should be replaced for a failed memory cell and means for programming how many of said failed memory cells should be replaced by said redundant memory cells, simultaneously.

18. A semiconductor memory device according to claim 17, wherein said redundant memory selection means (XRDN) selects a number of failed memory cells to be replaced by said redundant memory cell, from a group consisting of the numbers of 1, 2 and 4.

19. A semiconductor memory device according to claim 1, further comprising a plurality of redundant memory cell activating means and a plurality of memory and comparison means, wherein upon detection of a failed memory cell, an arbitrary redundant memory cell activation means is selected by each one of said memory and comparison means in response to an output of said redundant memory cell selection circuit.

20. A semiconductor memory device comprising:

a plurality of normal memory cells;

an activation device that activates said memory cells (XDEC) in response to an externally applied address;

a plurality of redundant memory cells;

a memory and comparison device (XRED) comprising a storage device that stores an address of a failed memory cell existing within said plurality of normal memory cells and a comparison device that compares said externally applied address with said failed memory cell address;

a redundant memory cell selection device (XRDN) that selects any one of said plurality of redundant memory cells in response to an output signal output from said memory and comparison device (XRED); and a redundant memory cell activating device (RXDC) that activates said redundant memory cell, responsive to an output of said memory and comparison device.

* * * * *